US012599033B2

(12) United States Patent
Pasdast et al.

(10) Patent No.: US 12,599,033 B2
(45) Date of Patent: Apr. 7, 2026

(54) QUASI-MONOLITHIC INTEGRATED PACKAGING ARCHITECTURE WITH MID-DIE SERIALIZER/DESERIALIZER

(71) Applicant: Intel Corporation, Santa Clara, CA (US)

(72) Inventors: Gerald S. Pasdast, San Jose, CA (US); Adel A. Elsherbini, Tempe, AZ (US); Nevine Nassif, Arlington, MA (US); Carleton L. Molnar, Northborough, MA (US); Vivek Kumar Rajan, Portland, OR (US); Peipei Wang, San Jose, CA (US); Shawna M. Liff, Scottsdale, AZ (US); Tejpal Singh, Shrewsbury, MA (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 960 days.

(21) Appl. No.: 17/557,166

(22) Filed: Dec. 21, 2021

(65) Prior Publication Data

US 2023/0197676 A1       Jun. 22, 2023

(51) Int. Cl.
*H01L 25/065* (2023.01)
*H01L 23/498* (2006.01)

(52) U.S. Cl.
CPC .... *H01L 25/0652* (2013.01); *H01L 23/49827* (2013.01); *H01L 23/49838* (2013.01); *H01L 23/49894* (2013.01)

(58) Field of Classification Search
None
See application file for complete search history.

(56) References Cited

U.S. PATENT DOCUMENTS

| | | | | |
|---|---|---|---|---|
| 2020/0075521 | A1* | 3/2020 | Elsherbini | H03M 9/00 |
| 2023/0176304 | A1* | 6/2023 | Winzer | G02B 6/4284 385/92 |
| 2023/0380095 | A1* | 11/2023 | Winzer | H04B 10/27 |
| 2025/0015902 | A1* | 1/2025 | Winzer | G02B 6/43 |

* cited by examiner

*Primary Examiner* — Long Pham
(74) *Attorney, Agent, or Firm* — Akona IP PC

(57) ABSTRACT

A microelectronic assembly is provided, comprising: a first integrated circuit (IC) die having a first connection to a first serializer/deserializer (SERDES) circuit and a second connection to a second SERDES circuit; a second IC die having the first SERDES circuit; and a third IC die having the second SERDES circuit, in which the first IC die is in a first layer, the second IC die and the third IC die are in a second layer not coplanar with the first layer, the first layer and the second layer are coupled by interconnects having a pitch of less than 10 micrometers between adjacent ones of the interconnects, and the first SERDES circuit and the second SERDES circuit are coupled by a conductive pathway.

20 Claims, 6 Drawing Sheets

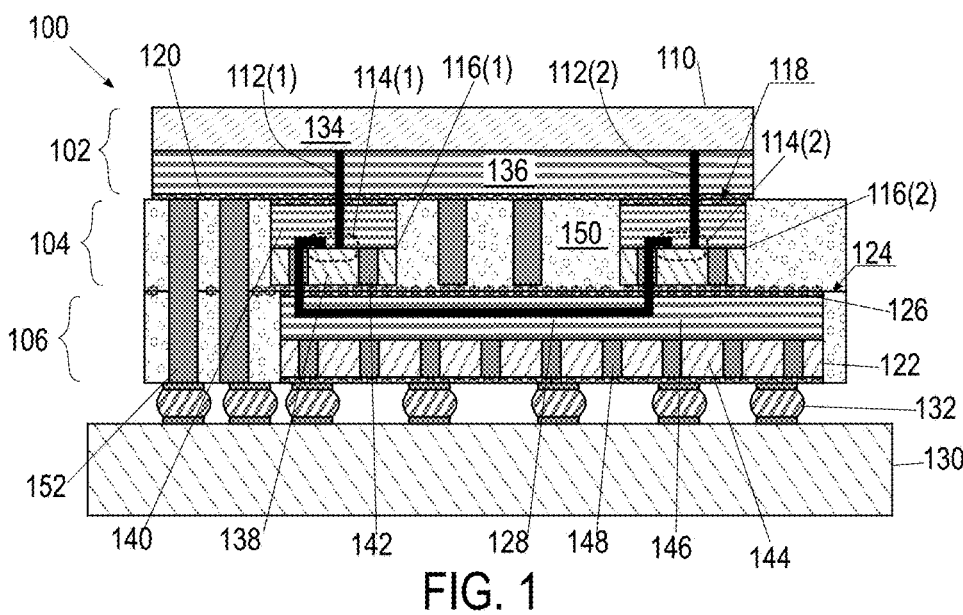
FIG. 1
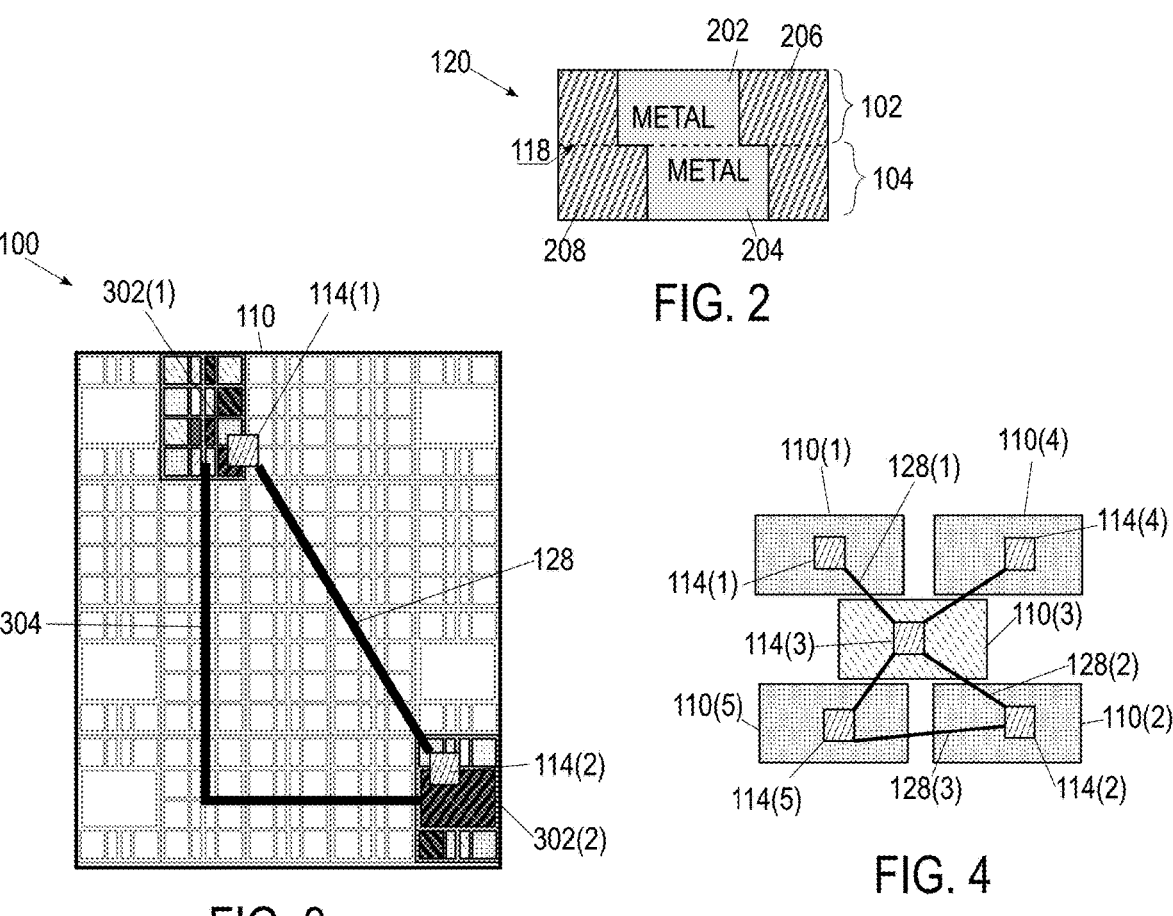
FIG. 2
FIG. 3
FIG. 4

100

112(1)  110(1)  114(1)  116  110(2)  112(2)

102

104

114(2)

128

100

908(1)  114(1)  902(1)  128  906(1)  904(2)  114(2)  910(1)

FROM
IC DIE
110(1)

TO
IC DIE
110(2)

116(1)

116(2)

112(1)

112(2)

TO
IC DIE
110(1)

FROM
IC DIE
110(2)

908(2)

910(2)

904(1)  906(2)  902(2)

QUASI-MONOLITHIC INTEGRATED PACKAGING ARCHITECTURE WITH MID-DIE SERIALIZER/DESERIALIZER

TECHNICAL FIELD

The present disclosure relates to techniques, methods, and apparatus directed to quasi-monolithic integrated packaging architecture with mid-die serializer/deserializer (SERDES).

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a simplified cross-sectional view of a microelectronic assembly 100 according to some embodiments of the present disclosure.

FIG. 2 is a simplified cross-sectional view of details in the example microelectronic assembly of FIG. 1, according to an embodiment of the present disclosure.

FIG. 3 is a simplified top view/block diagram of an example microelectronic assembly, according to another embodiment of the present disclosure.

FIG. 4 is a simplified top view/block diagram of an example microelectronic assembly, according to yet another embodiment of the present disclosure.

DETAILED DESCRIPTION

Overview

Figure 5:
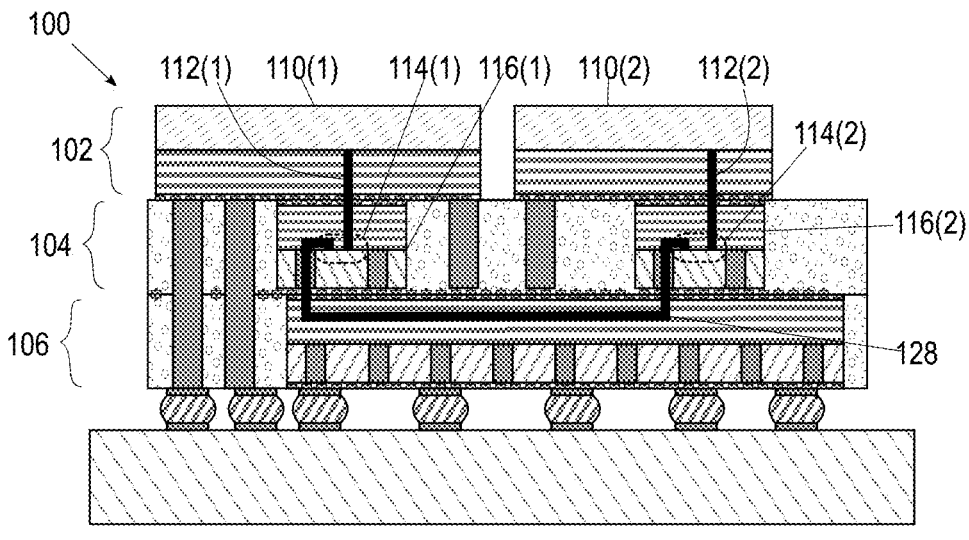
FIG. 5 is a simplified cross-sectional view of an example microelectronic assembly, according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller IC dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected together to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different dies, each one optimized in terms of design and manufacturing, the overall yield and cost of the combined die solution may be improved.

The connectivity between these dies is achievable by many different ways. For example, in 2.5D packaging solutions, a silicon interposer and through-substrate vias (TSVs), also called through-silicon vias where the substrate is silicon, connect dies at silicon-interconnect speed in a minimal footprint. In another example, interconnect bridges (e.g., Embedded Multi-Die Interconnect Bridge (EMIB™)), embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high-pitch solder-based bumps (e.g., C2 interconnections). The EMIB and the 3D stacked architecture may also be combined using an omni-directional interconnect (ODI), in which EMIB chips are embedded in an organic mold compound, which allows for top-packaged chips to communicate with other chips horizontally using EMIB and vertically, using through-mold vias (TMVs) which are typically larger than TSVs.

In addition, in large monolithic IC dies, communication latency from one arrayed compute agent (e.g., processor core circuitry) to another can vary drastically, for example, from as little as one clock cycle between adjacent neighbors to dozens of clock cycles between distant neighbors. The worst-case latency as well as the average latency between compute agents increase generationally as the number of compute agents increases. The further the sender is from the recipient, the longer the latency. Because lower latency is extremely important for high-performance computing, large monolithic IC dies pose a competitive disadvantage. Existing solutions in such architecture involve successive communication hops between adjacent compute agents in vertical (e.g., Y-dimension through the thickness of an IC package, using 2.5D or 3D packaging solutions) or horizontal (e.g., X-dimension through lateral pathways in the monolithic IC die) until the intended recipient is reached. However, because current interconnect technologies in 2.5D and 3D packaging architecture use solder or its equivalent for connectivity, with consequent low vertical and horizontal interconnect density, latency remains a challenge. For example, typical flip-chip solder bumps have a pitch of 112-150 micrometers, and a hundred of such bumps having a pitch of 112 micrometers will occupy an area of approximately 1.21 square millimeters.

In particular, a SERDES circuit is a pair of functional blocks commonly used in high-speed communications to convert data between serial data and parallel interfaces in each direction. SERDES circuits are typically used for communication between two different IC dies, or between two compute agents in a monolithic IC die. The functional blocks (and corresponding circuitry) in a typical SERDES include: transmission (TX) phase locked-loop (PLL), which produces a multi-gigahertz clock from a lower frequency (e.g., 25- to 100-MHz) reference clock; a receiver (RX) clock data recovery (CDR), which tracks the average phase of the incoming data; a TX line driver, which translates the serialized data into a differential signal; an RX equalizer, which equalizes high-speed channel effects either with a continuous time equalizer or with a Decision Feedback Equalization (DFE) or both, often with an automatic-gain-control (AGC); and high-speed serializer and deserializer logic (e.g., digital logic).

The SERDES is the most fundamental building block of a physical layer (PHY) for chip-to-chip interconnect systems; SERDES together with physical coding sublayer (PCS) forms the PHY of Open Systems Interconnection (OSI) model. Modern SOCs for high-performance computing (HPC), artificial intelligence (AI), automotive, mobile, and Internet-of-Things (IoT) applications implement SERDES that can support multiple data rates and standards like PCI Express (PCIe), Mobile Industry Processor Interface (MIPI), Ethernet, and USB. Because SERDES links between a pair of SERDES blocks are point to point connections, a large number of SERDES links are employed in large configurations of components, or several SERDES links are serially connected in a multi-hop configuration.

One of the key concerns for SERDES signal traces is the need to achieve a particular differential impedance (e.g., $50\Omega$, $100\Omega$, etc.), which may be impacted by trace width, trace spacing, distance between planes, and dielectric material surrounding the conductive traces forming the SERDES links. As the length of a SERDES link increases, so does the differential impedance and the latency. Existing solutions with multiple hops that involve placing several SERDES blocks in the communication pathway between the two IC dies or compute agents that are communicating may minimize the differential impedance between pairs of SERDES blocks; however, such solutions do not decrease latency, which remains of concern. Further, in large compute arrays, the multiple on-die hops are directly proportional to the XY array size (e.g., number of dies along the length and width respectively), for example, because each die (or compute block) has a SERDES circuit through which the data passes, leading to increased latency.

In this regard, a quasi-monolithic hierarchical integration architecture using recursively coupled plurality of dies to form microelectronic assemblies helps to mitigate several drawbacks mentioned above. The plurality of dies may comprise active dies and/or passive dies, and at least a portion in the plurality of dies are coupled using die-to-die (DTD) interconnects with sub-10 micrometer pitch, also referred to as "hybrid bonds," "hybrid interconnects," or "direct bond interconnects." In other words, the center-to-center separation between adjacent high-density interconnects is less than or equal to 10 micrometers. In such quasi-monolithic structures, IC dies are stacked in multiple layers with inorganic dielectric between the layers and around the IC dies. By using hybrid bonds or equivalent, having a pitch of less than 10 micrometers, an effective interconnection area may be reduced considerably from a corresponding interconnection area having the same number of flip-chip interconnects. For example, with 9 micrometer pitch, 100 hybrid bonds will occupy an effective area of approximately 0.0081 square millimeters, which is several orders of magnitude smaller than (e.g., 151.25× shrink factor) with flip-chip interconnects having a pitch of 112 micrometers. Electrical coupling through the dielectric is implemented with through-dielectric vias (TDVs) that are pass-through structures, i.e., they provide an electrical pathway between layers without any intermediate circuitry.

Some embodiments of the present disclosure provide a microelectronic assembly, comprising: a first IC die having a first connection to a first SERDES circuit and a second connection to a second SERDES circuit; a second IC die having the first SERDES circuit; and a third IC die having the second SERDES circuit, in which the first IC die is in a first layer, the second IC die and the third IC die are in a second layer not coplanar with the first layer, the first layer and the second layer are coupled by interconnects having a pitch of less than 10 micrometers between adjacent ones of the interconnects, and the first SERDES circuit and the second SERDES circuit are coupled by a conductive pathway.

Some embodiments also provide an IC package, comprising: a first IC die in a first layer; a second IC die and a third IC die in a second layer; and an interposer. The second layer is between the first layer and the interposer, the first layer is coupled to the second layer by interconnects having a pitch of less than 10 micrometers between adjacent ones of the interconnects, a first circuit block in the first IC die is coupled to a first SERDES circuit in the second IC die, a second circuit block in the second IC die is coupled to a second SERDES circuit in the third IC die, and the first SERDES circuit and the second SERDES circuit are coupled by a conductive pathway through the interposer.

Some embodiments also provide an IC structure, comprising: a first circuit connected to a first SERDES circuit; a second circuit connected to a second SERDES circuit; and a conductive pathway between the first SERDES circuit and the second SERDES circuit. The first circuit and the second circuit are in a first layer, the first SERDES circuit and the second SERDES circuit are in a second layer not coplanar with the second layer, and the first layer and the second layer are coupled by interconnects having a pitch of less than 10 micrometers between adjacent ones of the interconnects.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, DTD interconnects and die-to-package substrate (DTPS) interconnects. DTD interconnects may also be referred to as First-Level Interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
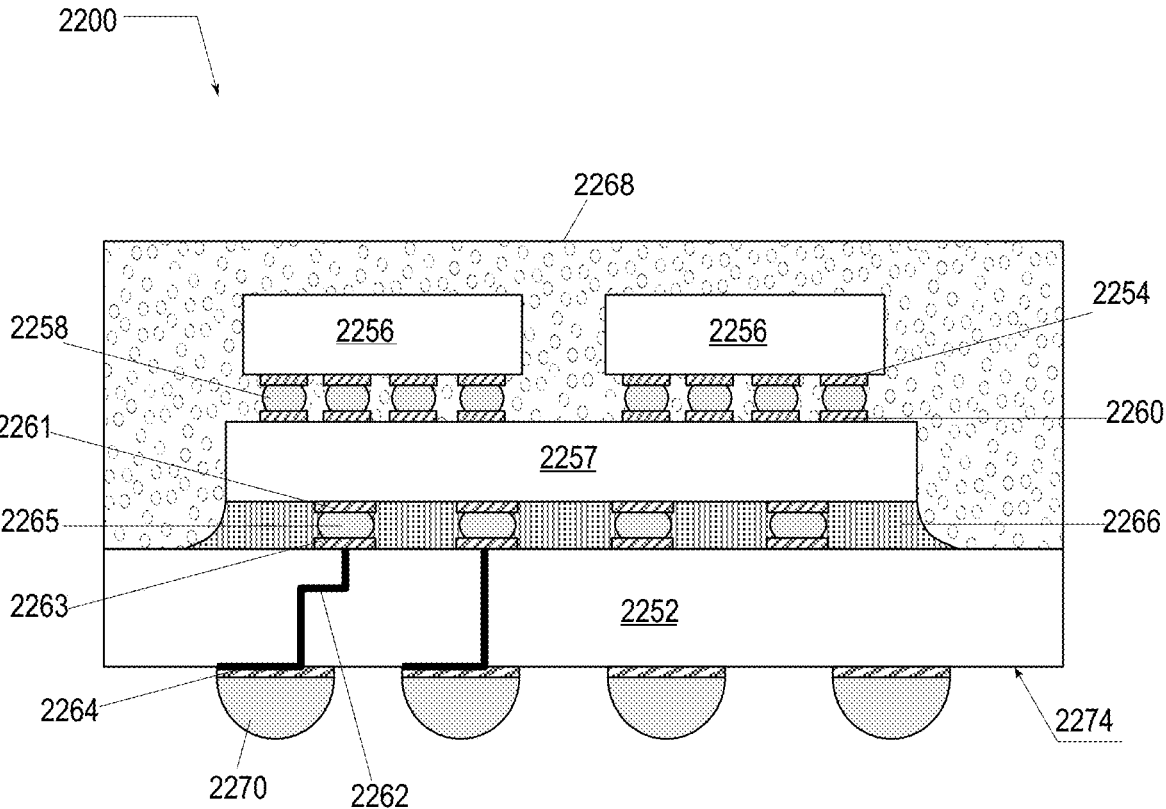
FIG. 10 is a cross-sectional view of a device package that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a simplified cross-sectional view of a microelectronic assembly 100 according to some embodiments of the present disclosure. Microelectronic assembly 100 comprises components in several non-coplanar layers, for example, layers 102, 104 and 106. An IC die 110 (collectively, "IC dies 110") provisioned in layer 102 may have one or more connections 112 (singly "connection 112") to one or more SERDES circuits 114 (singly "SERDES circuit 114"). For example, IC die 110 may have a connection 112(1) to SERDES circuit 114(1)) and another connection 112(2) to another SERDES circuit 114(2). SERDES circuits 114 may be provisioned in one or more IC dies 116 (singly "IC die 116") in a different layer than the one in which IC die 110 is located, for example, layer 104. In the example embodiment shown, SERDES circuit 114(1) is provisioned in IC die 116(1) and SERDES circuit 114(2) is provisioned in IC die 116(2). In various embodiments, IC dies 116 comprising SERDES circuit 114 may be located in a shadow of a termination point of connection 112 in IC die 110, or at any suitable location in layer 104 where connection 112 is as short as feasible. An interface 118 coupling layers 102 and 104 may comprise interconnects 120 having a pitch of less than 10 micrometers between adjacent ones of the interconnects. In an example embodiment, interconnects 120 may be DTD interconnects such as hybrid bonds (e.g., metal-to-metal bonds together with oxide-to-oxide bonds), copper pillars, etc.

In some embodiments, layer 106 may comprise one or more interposers 122 (singly "interposer 122"). Interposer 122 may comprise an IC die, as in the example embodiment shown. Interposer 122 may also comprise a package substrate in other embodiments. An interface 124 between layers 104 and 106 may comprise interconnects 126. In the example embodiment shown, interconnects 126 are similar to interconnects 120, and have a pitch of less than 10 micrometers between adjacent ones of the interconnects. In other embodiments, for example, where interposer 122 comprises an organic package substrate, interconnects 126 may be different from interconnects 120 and may have a pitch greater than 10 micrometers between adjacent ones of the interconnects. For example, interconnects 126 may comprise DTD interconnects in some embodiments, and DTPS interconnects in other embodiments. A conductive pathway 128 coupling SERDES circuits 114(1) and 114(2) may be through interposer 122 in layer 106.

In some embodiments, the components in layers 102, 104 and 106 may be coupled together into one discrete microelectronic assembly that may then be coupled to various other components, for example, component 130. In some embodiments where interposer 122 comprises an IC die, component 130 may comprise package substrate. In some embodiments where interposer 122 comprises an IC die, component 130 may comprise another IC die. In embodiments where interposer 122 comprises a package substrate, component 130 may comprise a PCB. Layer 106 may be coupled to component 130 by interconnects 132. In some embodiments, interconnects 132 may be the same as interconnects 126. In some other embodiments, interconnects 132 may be different from interconnects 126. In various embodiments, interconnects 132 may comprise DTPS interconnects.

Note that in various embodiments, IC die 110 comprises a substrate 134 and a metallization stack 136 parallel and adjacent to substrate 134. Active circuit elements (e.g., transistors, diodes, etc.) may be provided in substrate 134, and electrically coupled by conductive traces and vias in metallization stack 136. The active circuit elements and conductive traces/vias together comprise a circuit. Metallization stack 136 may include interlayer dielectric (ILD) and various layers of conductive material comprising conductive traces electrically coupled by conductive vias through the ILD. Other materials or/and layers, such as seed layers, adhesion layers, intermetallic compounds, not specifically shown the figure so as not to clutter the drawings may also be provided as may be known to those skilled in the art. Electrical signals, such as power and/or input/output (IO) signals, may be routed to and/or from the active circuit elements through one or more conductive traces and vias situated in metallization stack 136. The layers of conductive traces may comprise one or more power grids (e.g., an arrangement of conductive lines, planes and vias, that is used to provide power), signal grids (e.g., an arrangement of conductive lines, planes and vias that is used to provide signals (e.g., data)), and/or ground grids (e.g., an arrangement of conductive lines, planes and vias that is used to provide ground connection).

Substrate 134 may comprise materials discussed in the paragraphs above relating to substrates (e.g., base material) of IC dies. In some embodiments, the conductive traces within metallization stack 136 may include lines and/or vias filled with an electrically conductive material such as aluminum or copper. The lines comprising the conductive traces may be arranged to route electrical signals in a direction of a plane that is parallel with a surface of substrate 134. For example, the lines may route electrical signals in a direction in and out of the page from the perspective of FIG. 1. Vias may be arranged to route electrical signals in a direction of a plane that is perpendicular to the surface of substrate 134. In some embodiments, the vias may electrically couple lines of different conductive routing layers together.

The ILD may comprise layers between the layers of conductive traces, the ILD layers deposited over and in between the conductive traces. The ILD layers may be formed using dielectric materials known for their applicability in IC structures, such as low-k dielectric materials. Examples of dielectric materials include, but are not limited to, silicon dioxide ($SiO_2$), carbon-doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. The ILD may comprise a homogeneous material, or a heterogeneous layered composite comprising more than one layer of material, or a heterogeneous matrix comprising a mixture of materials in any suitable arrangement known in the art.

At least a portion of connection 112 may be provided in metallization stack 136, for example, comprising conductive traces and vias therein. At least a portion of connection 112 may comprise one or more of interconnects 120 also. IC die 116 may likewise comprise a substrate 138 and metallization stack 140. SERDES circuit 114 may be provisioned in substrate 138 and metallization stack 140. At least a portion of connection 112 may be provided in metallization stack 140, electrically coupled to SERDES circuit 114. For example, connection 112(1) may pass through conductive traces and vias in metallization stack 136, one or more of interconnects 120, and conductive traces and vias in metallization stack 140. IC die 116 may further comprise TSVs 142 through substrate 138 to provide electrical connectivity to a "backside" of IC die 116, for example, a side opposite to IC die 110. In some embodiments, some TSVs 142 may be larger than others; the larger TSVs may be used to provide power whereas the smaller TSVs may be used to communicate data, such as the data between SERDES circuits 114(1) and 114(2).

In embodiments where interposer 122 comprises an IC die, as shown, interposer 122 may also comprise a substrate 144 and a metallization stack 146. Conductive pathway 128 may be provided through the conductive traces and vias in metallization stack 146. Interconnects 126 may be comprised in conductive pathway 128. In an example embodiment, conductive pathway 128 may pass through conductive traces and vias in metallization stack 140, TSV 142, in IC dies 116(1) and 116(2), in addition to one or more of interconnects 126 and conductive traces and vias in metallization stack 146. TSVs 148 through substrate 144 may enable power and signals from component 130 suitably.

Layers 102, 104, and 106 may comprise a dielectric material 150. In some embodiments (as shown), dielectric material 150 may be provided in fewer number of layers; for example, layer 102 may not have dielectric material 150, whereas layers 104 and 106 may have dielectric material 150. In some embodiments, dielectric material 150 may comprise different compositions in each layer; in other embodiments, dielectric material 150 may comprise the same material in all layers in which it is provisioned. In some embodiments, dielectric material 150 comprises an inorganic dielectric, such as a compound of silicon and at least one of oxygen, nitrogen, and carbon (e.g., silicon oxide, silicon nitride, silicon carbide, silicon oxynitride, etc.). In other embodiments, dielectric material 150 comprises an organic material, such as mold compound, polyimide, ABF, etc. In various embodiments, conductive TDVs 152 (also referred to as TMVs where dielectric material 150 is mold compound) may be provided through the applicable layers. Some TDVs 152 may electrically couple layer 102 to component 130; some other TDVs 152 may electrically couple layer 102 to layer 106. Although three layers 102, 104 and 106 are shown in the example embodiment, in other embodiments, there may be fewer number of layers; in yet other embodiments, there may be more number of layers.

Such stacked configuration can be advantageous in multiple ways including by reducing latency in communication between SERDES circuits 114(1) and 114(2). Whereas an on-die implementation, for example, in IC die 110 may require multiple hops in the conductive pathway between SERDES circuits disposed therein, the embodiments as disclosed herein enable a single hop direct communication through conductive pathway 128 between any two SERDES circuits 114 provisioned in dedicated IC dies 116. Smaller bumps than in conventional flip-chip interconnects enabled by hybrid bonding facilitate implementation of stacked IC dies without significant performance degradation if the pitch of the hybrid bonds is at least an order of magnitude lower than traditional flip-chip bump pitches. Further, IC die 110 may be fabricated using semiconductor processes tailored to improve performance of the microcontroller circuit, whereas IC dies 116 may be fabricated using another semiconductor process tailored to improve performance of SERDES circuits 114 comprised therein. As a result, in some embodiments, transistors in IC die 110 may be smaller than transistors in IC dies 116.

Although a few IC dies (e.g., 110, 116, and 122) are shown in the figure, any fewer or greater number of IC dies may be included in microelectronic assembly 100 within the broad scope of the embodiments. The number, locations, arrangement, sizes, etc. of such IC dies may be determined by various operational, manufacturing, cost, and other considerations and any such number, locations, arrangement, sizes, etc. may be included within the broad scope of the embodiments of microelectronic assembly 100.

In some embodiments, any package substrate (e.g., 122 or 130) used in microelectronic assembly 100 may comprise multiple layers of conductive traces embedded in one or more layers of organic dielectric. For example, the package substrate may comprise a laminate substrate with several layers of metal planes or traces that are interconnected to each other by through-hole plated vias, with IO routing planes on the top and bottom layers, while the inner layers are used as a ground and power plane. In other embodiments, the package substrate may comprise a composite of organic and inorganic materials, for example, with an embedded semiconductor die in an organic substrate, or an organic substrate with inorganic passivation on exposed surfaces, etc.

Note that in FIG. 1, although some components of the assembly are illustrated as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components. Note that FIG. 1 and subsequent figures are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assemblies as shown in FIG. 1 and subsequent figures may include more dies along with other electrical components. Note that in FIG. 1 and in subsequent figures, the interconnects (e.g., 120, 126) are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering.

FIG. 2 is a simplified cross-sectional view of an example embodiment of one of interconnects 120 comprising a hybrid bond. At interface 118 between layer 102 and layer 104, conductive contact 202 (e.g., belonging to IC die 110) of layer 102 may bond with conductive contact 204 (e.g., belonging to IC die 116) of layer 104; likewise, dielectric material 206 (e.g., silicon oxide, silicon nitride, silicon oxynitride, etc. belonging to IC die 110) in layer 102 may bond with dielectric material 208 (e.g., silicon oxide, silicon nitride, silicon oxynitride, etc. belonging to IC die 116) in layer 104. The bonded interconnects form interconnects 120, comprising hybrid bonds, providing electrical and mechanical coupling between layer 102 and layer 104. Note that the structure as described may be applicable to any similar hybrid bonds, for example, in some embodiments of interconnects 126 at interface 124 between layer 104 and layer 106.

FIG. 3 is a simplified top view/block diagram of an example embodiment of microelectronic assembly 100. IC die 110 may comprise one or more circuit blocks 302, each circuit block 302 providing a specific functionality, such as 10 functionality, compute functionality, voltage regulation functionality, memory cache functionality, etc. Some circuit blocks 302 may comprise a collection of smaller circuit blocks therein. As used herein, the term "circuit block" refers to a circuit comprising a reusable unit of logic, cell, or IC layout design with a particular functionality and defined interface and serves as a building block in an IC die design. For example, circuit block 302 may comprise a set of memory registers, arithmetic logic unit (ALU), power converters, peripherals, programmable microprocessors, microcontrollers, digital signal processors, analog-digital mixed-signal processing blocks, configurable computing architectures, etc. In the example embodiment shown, such circuit blocks 302 may be arranged in an array of rows and columns. Connection 112(1) (not shown) to SERDES circuit 114(1) may terminate in circuit block 302(1); another connection 112(2) (not shown) to SERDES circuit 114(2) may terminate in another circuit block 302(2). Circuit blocks 302(1) may be separated from 302(2) by other circuit blocks of the array. Note that circuit blocks 302(1) and 302(2) are in layer 102 (not shown) whereas SERDES circuits 114(1) and 114(2) are in layer 104 (not shown).

A conductive pathway 304 through the array in IC die 110 may be used to couple circuit blocks 302(1) and 302(2) hypothetically. For purposes of communication between SERDES circuits 114(1) and 114(2), such conductive pathway 304 may comprise various other SERDES circuits in a multi-hop configuration, as the pathway passes through different circuit blocks. In other words, each circuit block may have its own SERDES circuit through which conductive pathway 304 may have to be routed. The length of conductive pathway 304 increases the farther circuit block 302(2) is from 302(1) and as the array size increases. On the other hand, conductive pathway 128 as described in FIG. 1 may be used to couple SERDES circuit 114(1) and 114(2), bypassing routing through IC die 110 and resulting in a shorter path without additional hops therein. Thus, not only is conductive pathway 128 between SERDES circuits 114(1) 114(2) through IC dies 116(1) and 116(2) shorter than conductive pathway 304, but any communication over conductive pathway 128 may also have lower latency than over conductive pathway 304. Further, by moving conductive pathway 128 out of IC die 110, conductive pathway 128 may be configured to have suitable differential impedance or other electrical characteristics independent of circuit blocks 302 in IC dies 110.

FIG. 4 is a simplified top view/block diagram of another example embodiment of microelectronic assembly 100. Instead of only one IC die 110 in layer 102, microelectronic assembly 100 may comprise a plurality of IC dies 110, for example, 110(1)-110(5). In some embodiments, each such IC die 110 may comprise a single circuit block 302 (not shown). In other embodiments, each IC die 110 may comprise a plurality of circuit blocks 302 as described in reference to the previous figure. Each IC die 110 may comprise a connection 112 (not shown) to at least one SERDES circuit 114. For example, IC dies 110(1)-110(5) may be coupled to SERDES circuits 114(1)-114(5), respectively. SERDES circuits 114 may be coupled to each other by conductive pathways 128. For example, conductive pathway 128(1) may couple SERDES circuits 114(1) and 114(3); conductive pathway 128(2) may couple SERDES circuits 114(2) and 114(3); conductive pathway 128(3) may couple SERDES circuits 114(2) and 114(5); and so on. Note that IC dies 110 are in layer 102 (not shown) whereas SERDES circuits 114 are in layer 104 (not shown), and at least portions of conductive pathways may be in another layer (e.g., 106, not shown).

FIG. 5 is a simplified cross-sectional view of another example embodiment of microelectronic assembly 100, according to various embodiments of the present disclosure. The embodiment shown in FIG. 5 is similar to the embodiment shown in FIG. 1, except that layer 102 comprises a plurality of IC dies 110(1) and 110(2). Note that many more such IC dies may be provisioned in layer 102 within the broad scope of the embodiments; only two IC dies are shown herein for illustrative purposes and not as a limitation. IC die 110(1) may have connection 112(1) to SERDES circuit 114(1) in IC die 116(1) and IC die 110(2) may have connection 112(2) to SERDES circuit 114(2) in IC die 116(2).

Figure 6:
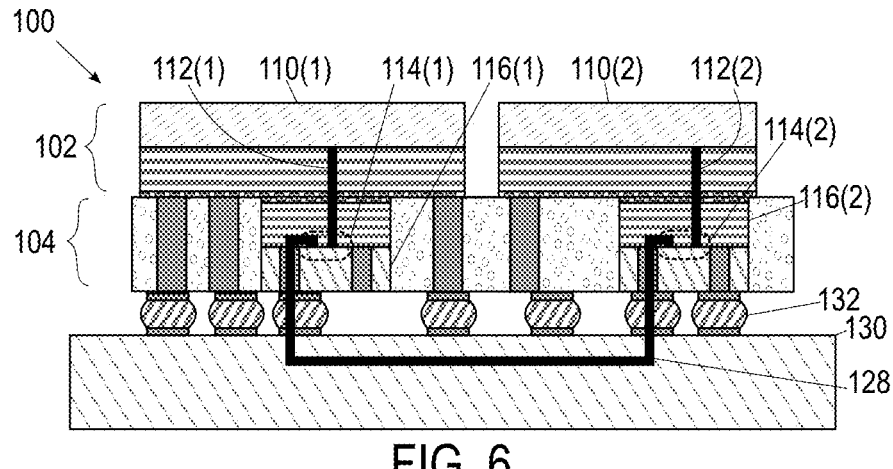
FIG. 6 is a simplified cross-sectional view of an example microelectronic assembly, according to yet another embodiment of the present disclosure.

FIG. 6 is a simplified cross-sectional view of another example embodiment of microelectronic assembly 100, according to various embodiments of the present disclosure. The embodiment shown in FIG. 6 is similar to the embodiment shown in FIG. 5, except that layer 106 is absent, and conductive pathway 128 is through component 130. In some such embodiments, component 130 may comprise a package substrate, and conductive pathway may be through the conductive traces in the package substrate. Conductive pathway in such embodiments may include interconnects 132.

Figure 7:
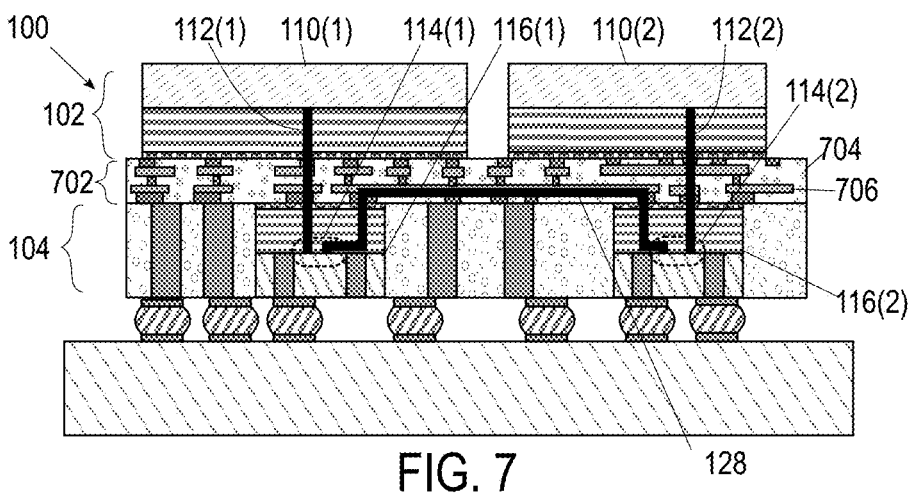
FIG. 7 is a simplified cross-sectional view of an example microelectronic assembly, according to yet another embodiment of the present disclosure.

FIG. 7 is a simplified cross-sectional view of another example embodiment of microelectronic assembly 100, according to various embodiments of the present disclosure. The embodiment shown in FIG. 7 is similar to the embodiment shown in FIG. 5, except that a redistribution layer 702 is present between layers 102 and 104. Redistribution layer 702 comprises dielectric material 704 with conductive traces 706 (including conductive vias) therein. In some embodiments, the material of dielectric material 704 may be the same as of dielectric material 150; in other embodiments, the material of dielectric material 704 may be different. In some embodiments, redistribution layer 702 may comprise several layers of dielectric material 704 with conductive traces 706 therebetween, and conductive vias connecting conductive traces in different layers. In some such embodiments, a portion of conductive pathway 128 may be provisioned through redistribution layer 702. Likewise, a portion of connections 112 may be provisioned through redistribution layer 702. Redistribution layer 702 may be coupled to layers 102 and 104 with interconnects 120 and/or conductive vias as appropriate. In some embodiments, redistribution layer 702 may be coupled to layer 102 with interconnects 120 and to layer 104 with conductive vias on bond pads; in other embodiments, redistribution layer 702 may be coupled to layer 104 with interconnects 120 and to layer 102 with conductive vias on bond pads.

Figures 8, 9:
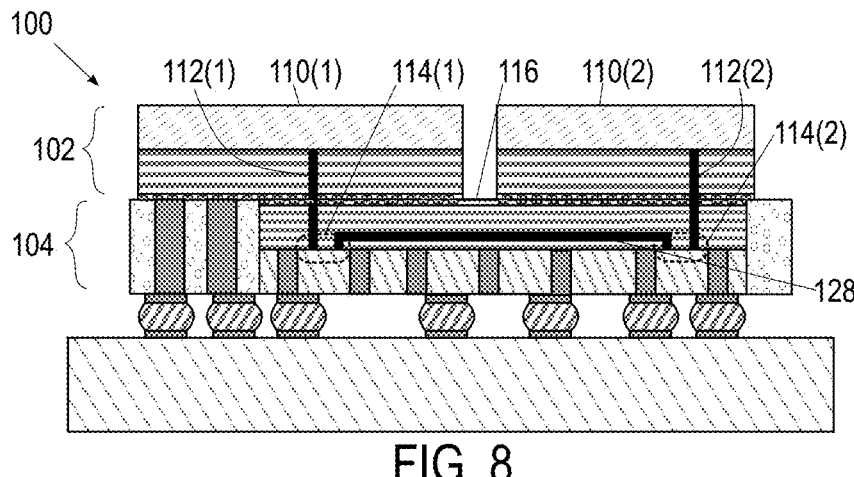
FIG. 8 is a simplified cross-sectional view of an example microelectronic assembly, according to yet another embodiment of the present disclosure.
FIG. 9 is a simplified block diagram of details in an example microelectronic assembly, according to yet another embodiment of the present disclosure.

FIG. 8 is a simplified cross-sectional view of another example embodiment of microelectronic assembly 100, according to various embodiments of the present disclosure. The embodiment shown in FIG. 8 is similar to the embodiment shown in FIG. 5, except that IC dies 116(1) and 116(2) are combined into a single IC die 116, layer 106 is absent, and conductive pathway 128 is through IC die 116. In some such embodiments, IC die 116 may comprise a plurality of SERDES circuits 114, each such SERDES circuit 114 coupled by respective connection 112 to circuit block 302 (not shown) in IC die 110. Various other components shown but not described are assumed to be understood as constituting elements of a typical SERDES circuit 114.

FIG. 9 is a simplified block diagram of an example embodiment of microelectronic assembly 100. In general, SERDES circuit 114 provisioned in IC die 116 in microelectronic assembly 100 may comprise one or more transmission (TX) blocks 902 and one or more receiver (RX) blocks 904. TX block 902 in one SERDES circuit may be coupled to RX block 904 in another SERDES circuit by a conductive trace 906. In some embodiments, conductive traces 906 may be provisioned in interposer 122. In some embodiments, conductive traces 906 may be provisioned in redistribution layer 702. In some embodiments, conductive traces 906 may be provisioned in IC die 116.

In the particular example embodiment shown, SERDES circuits 114(1) and 114(2) may be provisioned in separate IC dies 116(1) and 116(2). SERDES circuit 114(1) may comprise one or more TX blocks 902(1) and one or more RX blocks 904(1). Likewise, SERDES circuit 114(2) may comprise one or more TX blocks 902(2) and one or more RX blocks 904(2). TX block 902(1) is coupled by a conductive trace 906(1) to RX block 904(2). TX block 902(2) is coupled by another conductive trace 906(2) to RX block 904(1). Conductive pathway 128 coupling SERDES circuit 114(1) and 114(2) may comprise conductive traces 906(1) and 906(2). In various embodiments, conductive pathway 128 may comprise the plurality of conductive traces 906(1) coupling TX blocks 902(1) in SERDES circuit 114(1) and RX blocks 904(2) in SERDES circuit 114(2) and the plurality of conductive traces 906(2) coupling TX blocks 902(2) in SERDES circuit 114(2) and RX blocks 904(1) in SERDES circuit 114(1).

One or more conductive traces 908 may communicate electrical signals back and forth between IC die 110(1) and SERDES circuit 114(1). For example, conductive traces 908(1), comprising for example, four different conductive traces, each conductive trace carrying a corresponding channel of data, may bring electrical signals from IC die 110(1) to SERDES circuit 114(1); likewise, conductive traces 908(2), comprising for example, four different conductive traces, each conductive trace carrying a corresponding channel of data, may bring electrical signals from SERDES circuit 114(1) to IC die 110(1). All of such conductive traces 908 may be comprised in connection 112(1). Likewise, one or more conductive traces 910 may communicate electrical signals back and forth between IC die 110(2) and SERDES circuit 114(2). For example, conductive traces 910(1), comprising for example, four different conductive traces, each conductive trace carrying a corresponding channel of data, may bring electrical signals from SERDES circuit 114(2) to IC die 110(2); likewise, conductive traces 910(2), comprising for example, four different conductive traces, each conductive trace carrying a corresponding channel of data, may bring electrical signals from IC die 110(2) to SERDES circuit 114(2). All of such conductive traces 910 may be comprised in connection 112(2).

In various embodiments, any of the features discussed with reference to any of FIGS. 1-9 herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 11:
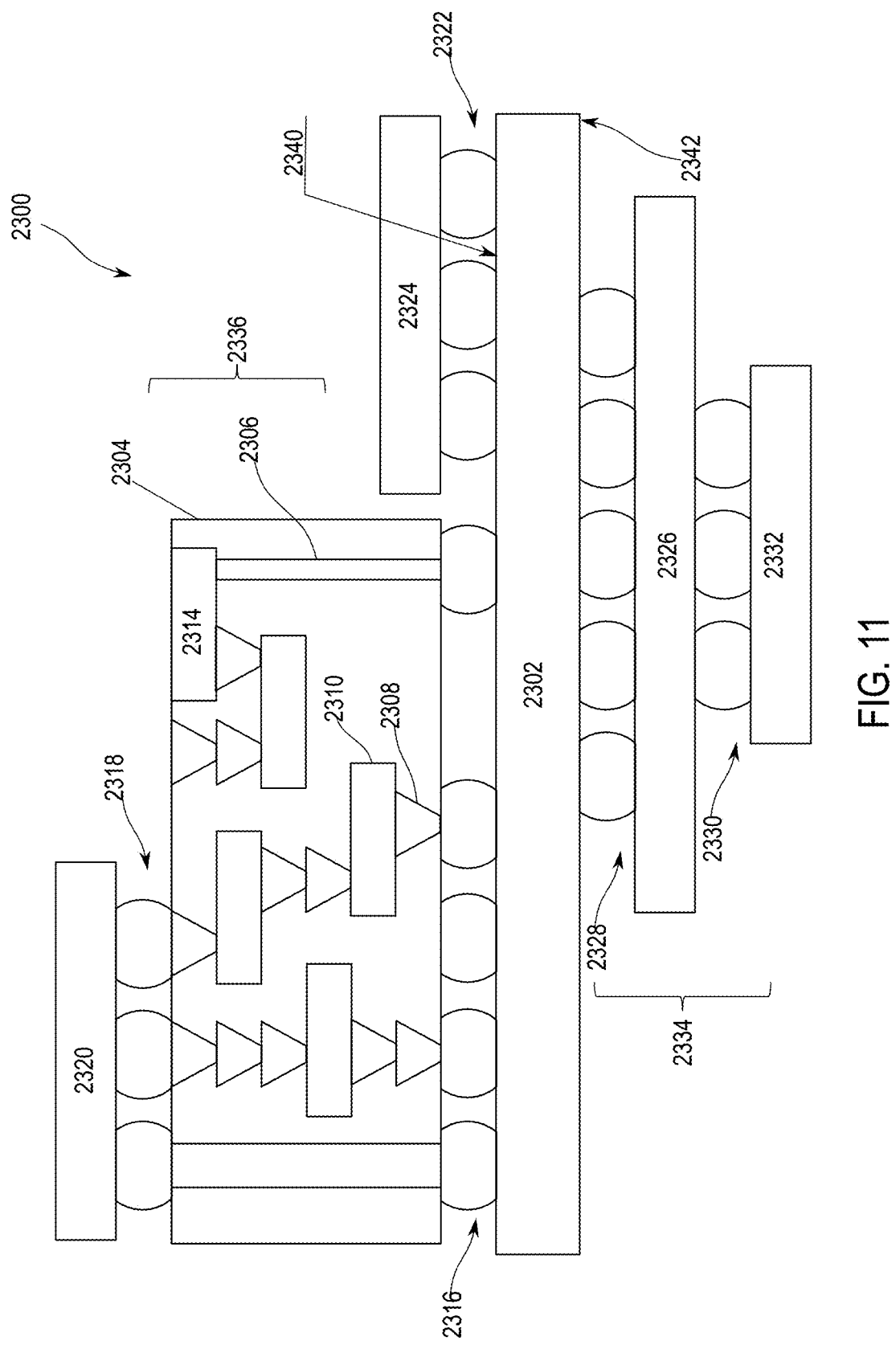
FIG. 11 is a cross-sectional side view of a device assembly that includes one or more microelectronic assemblies in accordance with any of the embodiments disclosed herein.
Figure 12:
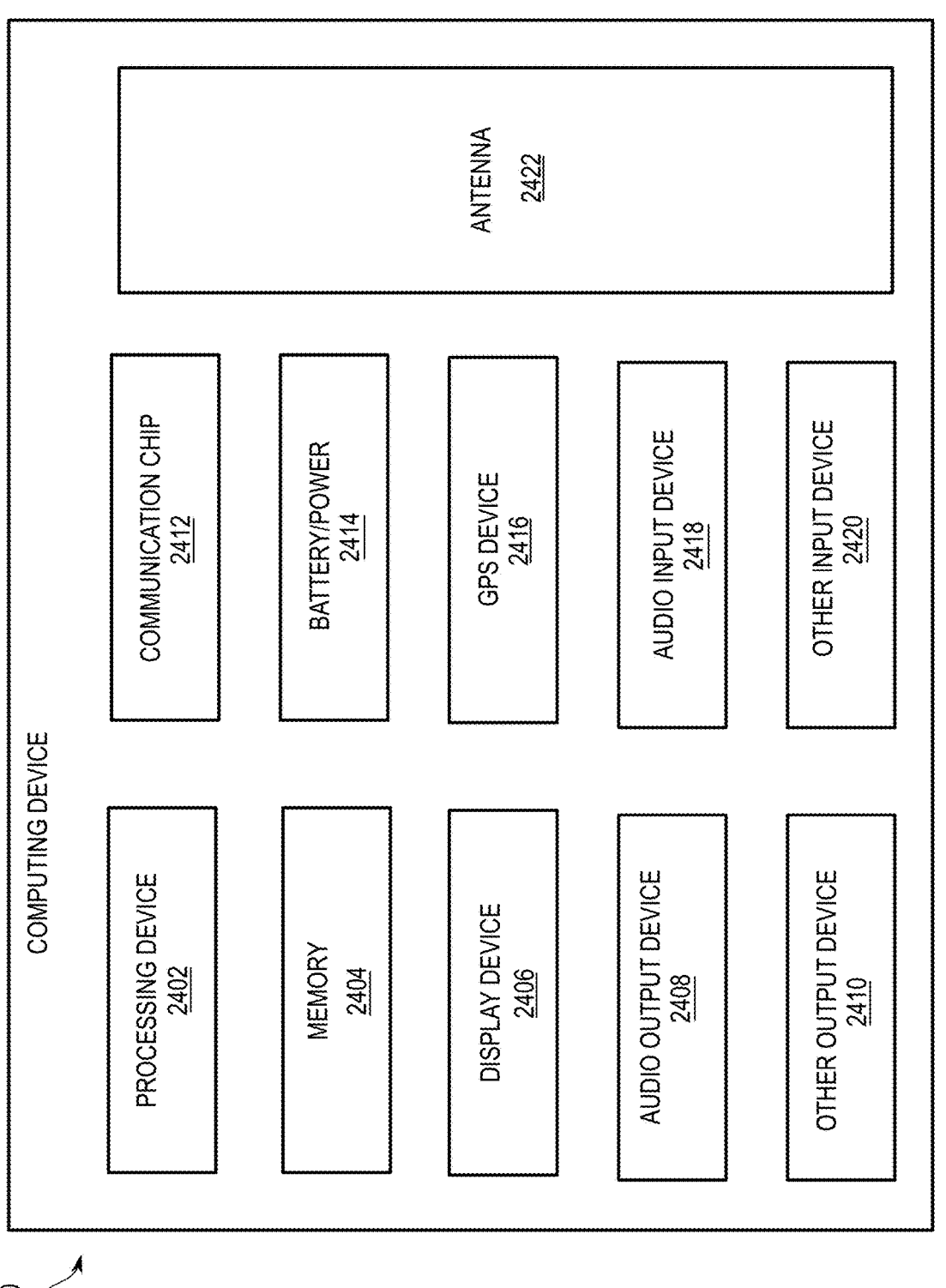
FIG. 12 is a block diagram of an example computing device that includes one or more microelectronic assemblies in accordance with any of the embodiments disclosed herein.

The packages disclosed herein, e.g., any of the embodiments shown in FIGS. 1-9 or any further embodiments described herein, may be included in any suitable electronic component. FIGS. 10-12 illustrate various examples of packages, assemblies, and devices that may be used with or include any of the IC packages as disclosed herein.

FIG. 10 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device

2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100), comprising: a first IC die (e.g., 110) having a first connection (e.g., 112(1)) to a SERDES circuit (e.g., 114(1)) and a second connection (e.g., 112(2)) to a second SERDES circuit (e.g., 114(2)); a second IC die (e.g., 116(1)) having the first SERDES circuit; and a third IC die (e.g., 116(2)) having the second SERDES circuit, in which: the first IC die is in a first layer (e.g., 102), the second IC die and the third IC die are in a second layer (e.g., 104), the second layer is not coplanar with the first layer, the first layer and the second layer are coupled by interconnects (e.g., 120, FIG. 2) having a pitch of less than 10 micrometers between adjacent ones of the interconnects, and the first SERDES circuit and the second SERDES circuit are coupled by a conductive pathway (e.g., 128).

Example 2 provides the microelectronic assembly of example 1, in which: the conductive pathway is through an interposer (e.g., 122), and the second layer is between the first layer and the interposer (e.g., FIG. 1).

Example 3 provides the microelectronic assembly of example 2, in which the interposer comprises an organic package substrate (e.g., 130, FIG. 6).

Example 4 provides the microelectronic assembly of example 2, in which the interposer comprises a fourth IC die (e.g., 122, FIG. 1).

Example 5 provides the microelectronic assembly of example 1, in which the conductive pathway is through a redistribution layer (e.g., 702, FIG. 7) between the first layer and the second layer.

Example 6 provides the microelectronic assembly of any of examples 1-5, in which transistors in the first IC die are smaller than transistors in the second IC die and the third IC die.

Example 7 provides the microelectronic assembly of any of examples 1-6, in which: the first connection comprises at least one of the interconnects, and the second connection comprises at least another of the interconnects.

Example 8 provides the microelectronic assembly of any of examples 1-7, in which (e.g., FIG. 3): the first IC die comprises a plurality of circuit blocks (e.g., 302) arranged in an array of rows and columns, the first connection to the first SERDES circuit terminates inside a first circuit block (e.g., 302(1)) of the array, the second connection to the second SERDES circuit terminates inside a second circuit block (e.g., 302(2)) of the array, the first circuit block is separated from the second circuit block by other circuit blocks of the array, a first conductive pathway (e.g., 128) between the first SERDES circuit and the second SERDES circuit through the second IC die and the third IC die is shorter than a second conductive pathway (e.g., 304) between the first SERDES circuit and the second SERDES circuit through the array.

Example 9 provides the microelectronic assembly of any of examples 1-8, further comprising (e.g., FIGS. 4, 5): a fourth IC die (e.g., 101(2)) in the first layer, the fourth IC die having a third connection (e.g., 112(2)) to a third SERDES circuit (e.g., 114(2)); and a fifth IC die (e.g., 116(2)) in the second layer, the fifth IC die having the third SERDES circuit, in which: the third connection comprises at least one of the interconnects, the conductive pathway is a first conductive pathway, and the first SERDES circuit and the third SERDES circuit are coupled by a second conductive pathway (e.g., 128).

Example 10 provides the microelectronic assembly of any of examples 1-9, in which the second IC die and the third IC die are part of a fourth IC die (e.g., 116, FIG. 8).

Example 11 provides an IC package (e.g., 100), comprising: a first IC die (e.g., 110) in a first layer (e.g., 102); a second IC die (e.g., 116(1)) and a third IC die (e.g., 116(2)) in a second layer (e.g., 104); and an interposer (e.g., 122, 130), in which: the second layer is between the first layer and the interposer, the first layer is coupled to the second layer by interconnects (e.g., 120) having a pitch of less than 10 micrometers between adjacent ones of the interconnects, a first circuit block (e.g., 302(1)) in the first IC die is coupled to a first SERDES circuit (e.g., 114(1)) in the second IC die, a second circuit block (e.g., 302(2)) in the second IC die is coupled to a second SERDES circuit (e.g. 114(2)) in the third IC die, and the first SERDES circuit and the second SERDES circuit are coupled by a conductive pathway (e.g., 128) through the interposer.

Example 12 provides the IC package of example 11, further comprising: a fourth IC die in the first layer coupled to a third SERDES circuit; and a fifth IC die having the third SERDES circuit, in which: the fifth IC die is in the second layer, the conductive pathway is a first conductive pathway, and the first SERDES circuit and the third SERDES circuit are coupled by a second conductive pathway through the interposer.

Example 13 provides the IC package of example 12, in which the second SERDES circuit and the third SERDES circuit are coupled by a third conductive pathway (e.g., 128(3), FIG. 4) through the interposer.

Example 14 provides the IC package of any of examples 11-13, in which the interposer comprises a package substrate with layers of organic dielectric material with conductive traces between the layers of organic dielectric material and conductive vias coupling the conductive traces through the layers of organic dielectric material.

Example 15 provides the IC package of example 14, in which the second layer is coupled to the interposer with interconnects (e.g., 132) having a pitch of greater than 10 micrometers between adjacent ones of the interconnects.

Example 16 provides the IC package of any of examples 11-13, in which the interposer comprises a fourth IC die.

Example 17 provides the IC package of example 16, in which the second layer is coupled to the interposer with interconnects having a pitch of less than 10 micrometers between adjacent ones of the interconnects.

Example 18 provides the IC package of any of examples 11-17, in which the conductive pathway comprises a conductive trace through the interposer without any intervening circuits.

Example 19 provides the IC package of any of examples 11-18, in which the second layer comprises a dielectric material (e.g., 150) with TDVs (e.g., 152) in the dielectric material surrounding the second IC die and the third IC die.

Example 20 provides the IC package of any of examples 11-19, further comprising a PCB (e.g., 130) coupled to the interposer (e.g., 122).

Example 21 provides an IC structure, comprising: a first circuit (e.g., 302(1)) connected to a first SERDES circuit (e.g., 114(1)); a second circuit (e.g., 302(2)) connected to a second SERDES circuit (e.g., 114(2)); and a conductive pathway (e.g., 128) between the first SERDES circuit and the second SERDES circuit, in which: the first circuit and the second circuit are in a first layer (e.g., 102), the first SERDES circuit and the second SERDES circuit are in a second layer (e.g., 104), the first layer is not coplanar with the second layer, and the first layer and the second layer are coupled by interconnects (e.g., 120) having a pitch of less than 10 micrometers between adjacent ones of the interconnects.

Example 22 provides the IC structure of example 21, in which the first circuit and the second circuit are in a first IC die (e.g., 110, FIG. 1), the first SERDES circuit is in a second IC die (e.g., 116(1)), and the second SERDES circuit is in a third IC die (e.g., 116(2)).

Example 23 provides the IC structure of example 21, in which (e.g., FIG. 5) the first circuit is in a first IC die (e.g., 110(1)), the second circuit is in a second IC die (e.g., 110(2)), the first SERDES circuit is in a third IC die (e.g., 116(2)), and the second SERDES circuit is in a fourth IC die (e.g., 116(2)).

Example 24 provides the IC structure of any of examples 21-23, in which: the conductive pathway is through a third layer (e.g., 106), and the second layer is between the first layer and the third layer.

Example 25 provides the IC structure of example 24, in which (e.g., FIG. 6): the third layer comprises a package substrate (e.g., 130) having organic dielectric layers, and the conductive pathway is through the package substrate.

Example 26 provides the IC structure of example 24, in which (e.g., FIG. 1): the third layer comprises an IC die (e.g., 122), and the conductive pathway is through the IC die.

Example 27 provides the IC structure of any of examples 21-23, in which (e.g., FIG. 7) the conductive pathway is through a redistribution layer (e.g., 702) between the first layer and the second layer.

Example 28 provides the IC structure of any of examples 21-27, in which: the first circuit is coupled to the first SERDES circuit by at least one of the interconnects, and the second circuit is coupled to the second SERDES circuit by at least another of the interconnects.

Example 29 provides the IC structure of any of examples 21-28, in which (e.g., FIG. 9): a first TX block (e.g., 902(1)) of the first SERDES circuit is coupled by a first conductive trace (e.g., 904(1)) to a first RX block (e.g., 906(2)) of the second SERDES circuit, a second RX block (e.g., 906(1)) of the first SERDES circuit is coupled by a second conductive trace (e.g., 904(2)) to a second TX block (e.g., 902(2)) of the second SERDES circuit, and the conductive pathway (e.g., 128) comprises the first conductive trace and the second conductive trace.

Example 30 provides the IC structure of any of examples 21-28, in which (e.g., FIG. 9): a first plurality of TX blocks of the first SERDES circuit is coupled by a first set of conductive traces to a first plurality of RX blocks of the second SERDES circuit, and a second plurality of RX blocks of the first SERDES circuit is coupled by a second set of conductive traces to a second plurality of TX blocks of the second SERDES circuit, and the conductive pathway comprises the first set of conductive traces and the second set of conductive traces.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a first integrated circuit (IC) die that is a single die;
a plurality of interconnects coupled to the first IC die, the plurality of interconnects arranged at a pitch of less than 10 micrometers between adjacent ones of the interconnects;
a second IC die coupled to a first portion of the plurality of interconnects, the second IC die having a first SERDES circuit; and
a third IC die coupled to a second portion of the plurality of interconnects, the third IC die having a second SERDES circuit,
wherein:
the first IC die is in a first layer,
the second IC die and the third IC die are in a second layer,
the second layer is not coplanar with the first layer, and
the first SERDES circuit and the second SERDES circuit are coupled by a conductive pathway.

2. The microelectronic assembly of claim 1, wherein:
the conductive pathway is through an interposer, and
the second layer is between the first layer and the interposer.

3. The microelectronic assembly of claim 2, wherein the interposer comprises an organic package substrate.

4. The microelectronic assembly of claim 2, wherein the interposer comprises a fourth IC die.

5. The microelectronic assembly of claim 1, wherein the conductive pathway is through a redistribution layer between the first layer and the second layer.

6. The microelectronic assembly of claim 1, wherein:

a first connection between the first IC die and the first SERDES circuit comprises at least one of the interconnects, and a second connection between the first IC die and the second SERDES circuit comprises at least another of the interconnects.

7. The microelectronic assembly of claim 1, further comprising:

a fourth IC die in the first layer, the fourth IC die having a third connection to a third SERDES circuit; and a fifth IC die in the second layer, the fifth IC die having the third SERDES circuit, wherein:

the third connection comprises at least one of the interconnects, the conductive pathway is a first conductive pathway, and the first SERDES circuit and the third SERDES circuit are coupled by a second conductive pathway.

8. The microelectronic assembly of claim 1, wherein the second IC die and the third IC die are part of a fourth IC die.

9. An IC package, comprising:

a first IC die in a first layer, wherein the first IC die is a single die;

a second IC die and a third IC die in a second layer; and an interposer, wherein:

the second layer is between the first layer and the interposer, the first layer is coupled to the second layer by interconnects having a pitch of less than 10 micrometers between adjacent ones of the interconnects, a first circuit block in the first IC die is coupled to and at least partially vertically overlapping a first SERDES circuit in the second IC die, a second circuit block in the first IC die is coupled to and at least partially vertically overlapping a second SERDES circuit in the third IC die, and the first SERDES circuit and the second SERDES circuit are coupled by a conductive pathway through the interposer.

10. The IC package of claim 9, further comprising:

a fourth IC die in the first layer coupled to a third SERDES circuit; and a fifth IC die having the third SERDES circuit, wherein:

the fifth IC die is in the second layer, the conductive pathway is a first conductive pathway, and the first SERDES circuit and the third SERDES circuit are coupled by a second conductive pathway through the interposer.

11. The IC package of claim 10, wherein the second SERDES circuit and the third SERDES circuit are coupled by a third conductive pathway through the interposer.

12. The IC package of claim 9, wherein the interposer comprises a package substrate with layers of organic dielectric material with conductive traces between the layers of organic dielectric material and conductive vias coupling the conductive traces through the layers of organic dielectric material.

13. The IC package of claim 9, wherein the interposer comprises a fourth IC die.

14. The IC package of claim 13, wherein the second layer is coupled to the interposer with interconnects having a pitch of less than 10 micrometers between adjacent ones of the interconnects.

15. The IC package of claim 9, wherein the conductive pathway comprises a conductive trace through the interposer without any intervening circuits.

16. The IC package of claim 9, wherein the second layer comprises a dielectric material with through-dielectric vias (TDVs) in the dielectric material surrounding the second IC die and the third IC die.

17. An IC structure, comprising:

a first circuit in a single die in a first layer, the first circuit coupled to a first SERDES circuit in a second layer by a first set of interconnects having a pitch of less than 10 micrometers between adjacent ones of the first set of interconnects;

a second circuit in the single die in the first layer, the second circuit coupled to a second SERDES circuit in the second layer by second first set of interconnects having a pitch of less than 10 micrometers between adjacent ones of the second set of interconnects; and a conductive pathway between the first SERDES circuit and the second SERDES circuit, wherein:

the first layer is not coplanar with the second layer.

18. The IC structure of claim 17, wherein the first circuit and the second circuit are in a first IC die, the first SERDES circuit is in a second IC die, and the second SERDES circuit is in a third IC die.

19. The IC structure of claim 17, wherein:

a first transmission (TX) block of the first SERDES circuit is coupled by a first conductive trace to a first receiver (RX) block of the second SERDES circuit, a second RX block of the first SERDES circuit is coupled by a second conductive trace to a second TX block of the second SERDES circuit, and the conductive pathway comprises the first conductive trace and the second conductive trace.

20. The IC structure of claim 17, wherein the first circuit is at least partially vertically overlapping the first SERDES circuit, and the second circuit is at least partially vertically overlapping the second SERDES circuit.

* * * * *